United States Patent
Moon et al.

(10) Patent No.: US 10,898,952 B2
(45) Date of Patent: Jan. 26, 2021

(54) COMPOSITION FOR FORMING ELECTRODE, ELECTRODE MANUFACTURED USING THE SAME AND SOLAR CELL

(71) Applicant: Samsung SDI Co., Ltd., Yongin-si (KR)

(72) Inventors: Sungil Moon, Suwon-si (KR); Kyoungjin Ha, Suwon-si (KR); Hansong Lee, Suwon-si (KR)

(73) Assignee: Samsung SDI Co., Ltd., Yongin-Si (KR)

(*) Notice: Subject to any disclaimer, the term of this patent is extended or adjusted under 35 U.S.C. 154(b) by 53 days.

(21) Appl. No.: 16/202,649

(22) Filed: Nov. 28, 2018

(65) Prior Publication Data
US 2019/0321883 A1    Oct. 24, 2019

(30) Foreign Application Priority Data
Apr. 23, 2018    (KR) .................. 10-2018-0046912

(51) Int. Cl.
*H01B 1/22*    (2006.01)
*C09D 5/24*    (2006.01)
(Continued)

(52) U.S. Cl.
CPC .......... *B22F 1/0074* (2013.01); *B22F 1/0048* (2013.01); *C09D 5/24* (2013.01);
(Continued)

(58) Field of Classification Search
CPC ... H01B 1/00; H01B 1/20; H01B 1/22; C09D 5/24; H01L 31/0224
See application file for complete search history.

(56) References Cited

U.S. PATENT DOCUMENTS 5,756,008 A * 5/1998 Slutsky .................. C09D 5/24
                                                    252/514
6,994,948 B2 * 2/2006 Glicksman ............ G03F 7/0047
                                                    430/270.1
(Continued)

FOREIGN PATENT DOCUMENTS

CN    101030038 A    9/2007
CN    103709572 A    4/2014
(Continued)

OTHER PUBLICATIONS

Ashland Product Data Sheet PVP/VA S-630 copolymer (2 pages) 2014.*
(Continued)

*Primary Examiner* — Mark Kopec
(74) *Attorney, Agent, or Firm* — Lee IP Law, PC

(57) ABSTRACT

A composition for forming an electrode includes a conductive powder, a glass frit, an organic binder, and a solvent. The organic binder includes a polymer including a structural unit represented by Chemical Formula 1 and a structural unit represented by Chemical Formula 2.

[Chemical Formula 1]

(Continued)

-continued

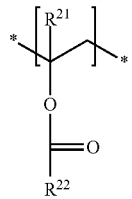

[Chemical Formula 2]

In Chemical Formulae 1 and 2, each substituent of Chemical Formulae 1 and 2 is the same as in the detailed description.

11 Claims, 1 Drawing Sheet

(51) Int. Cl.
  *H01L 31/00* (2006.01)
  *B22F 1/00* (2006.01)
  *H01L 31/0224* (2006.01)

(52) U.S. Cl.
  CPC ....... *H01B 1/22* (2013.01); *H01L 31/022425* (2013.01); *B22F 2301/255* (2013.01); *B22F 2304/10* (2013.01)

(56) References Cited

U.S. PATENT DOCUMENTS

| | | | | |
|---|---|---|---|---|
| 10,522,697 B2* | 12/2019 | Moon | ......................... | C03C 8/02 |
| 2008/0224102 A1* | 9/2008 | Lee | ........................... | H01B 1/22 |
| | | | | 252/514 |
| 2010/0096002 A1* | 4/2010 | Hayashi | ................... | H01B 1/22 |
| | | | | 136/252 |
| 2011/0151153 A1 | 6/2011 | Felder et al. | | |
| 2012/0164777 A1* | 6/2012 | Kleine Jaeger | ... | H01L 31/02242 |
| | | | | 438/57 |
| 2017/0054041 A1* | 2/2017 | Park | ........................ | H01B 1/22 |

FOREIGN PATENT DOCUMENTS

| | | |
|---|---|---|
| CN | 104078092 A | 10/2014 |
| CN | 104769682 A | 7/2015 |
| CN | 104979034 A | 10/2015 |
| CN | 106098139 A | 11/2016 |
| CN | 106469580 A | 3/2017 |
| KR | 10-0776133 B1 | 11/2007 |
| KR | 10-2011-0030539 A | 3/2011 |
| KR | 10-2011-0069724 A | 6/2011 |
| KR | 10-2013-0049751 A | 11/2012 |
| KR | 10-1378074 B1 | 3/2014 |
| KR | 10-1422089 B1 | 7/2014 |
| KR | 10-1693840 B1 | 1/2017 |
| KR | 10-2017-0022846 A | 3/2017 |
| KR | 10-2017-0077733 A | 7/2017 |

OTHER PUBLICATIONS

Taiwanese Office Action dated Apr. 24, 2019, (No English language translation).

Ng Hon Ming, "Optimization of Dye-Sensitized Solar Cells With Poly(1-Vinylpyrrolidone-Co-Vinyl Acetate) Gel Polymer Electrolytes Containing Binary Salts and Ionic Liquid", Faculty of Science, University of Malaya, Kuala Lumpur, 2016.

H. M. Ng, S. Ramesh et al, "Quasi-Solid Polymer Electrolyte Composed of poly(1-vinylpyrrolidone-co-vinyl acetate) Copolymer and the Influence of Its Composition on Electrochemical Properties and the Performances of Dye-Sensitized Solar Cells", Journal Polymer-Plastics Technology and Engineering, 2018, vol. 57, Issue 2.

Chinese Office Action and Search Report dated May 27, 2020, (No English language translation provided).

Korean Notice of Allowance dated Nov. 18, 2020 (No English language translation).

* cited by examiner

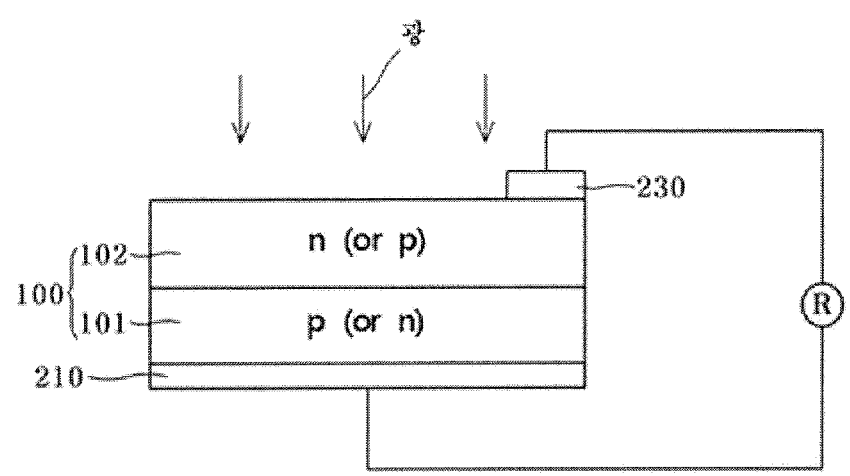

COMPOSITION FOR FORMING ELECTRODE, ELECTRODE MANUFACTURED USING THE SAME AND SOLAR CELL

CROSS-REFERENCE TO RELATED APPLICATION

Korean Patent Application No. 10-2018-0046912 filed on Apr. 23, 2018, in the Korean Intellectual Property Office, and entitled: "Composition for Forming Electrode, Electrode Manufactured Using the Same and Solar Cell," is incorporated by reference herein in its entirety.

BACKGROUND

1. Field

Embodiments relate to a composition for forming an electrode, an electrode, and a solar cell.

2. Description of the Related Art

Solar cells generate electrical energy using the photovoltaic effect of a p-n junction which converts photons of sunlight into electricity. In the solar cell, front and rear electrodes are formed on front and rear surfaces of a semiconductor substrate (semiconductor wafer) with the p-n junction, respectively. A photovoltaic effect of the p-n junction is induced by sunlight entering the substrate and electrons generated by the photovoltaic effect of the p-n junction provide an electric current to the outside through the electrodes.

SUMMARY

Embodiments are directed to a composition for forming an electrode, including a solvent, a conductive powder, a glass frit, and an organic binder, the organic binder including a polymer that includes a structural unit represented by Chemical Formula 1 and a structural unit represented by Chemical Formula 2:

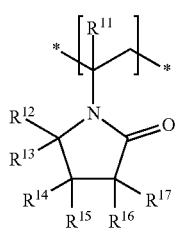

[Chemical Formula 1]

In Chemical Formula 1, $R^{11}$ may be hydrogen or a methyl group, and $R^{12}$, $R^{13}$, $R^{14}$, $R^{15}$, $R^{16}$, and $R^{17}$ are independently selected from hydrogen and a linear or branched C1 to C10 alkyl group.

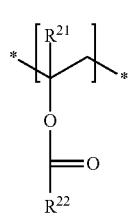

[Chemical Formula 2]

In Chemical Formula 2, $R^{21}$ may be hydrogen or a methyl group, and $R^{22}$ may be selected from a substituted or unsubstituted linear or branched C1 to C30 alkyl group, a substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

The structural unit represented by Chemical Formula 2 may be represented by Chemical Formula 2-1:

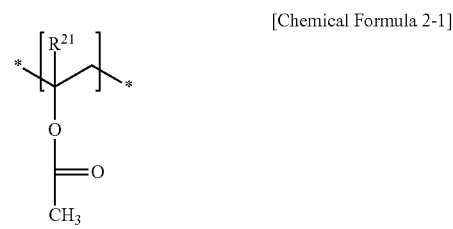

[Chemical Formula 2-1]

In Chemical Formula 2-1, $R^{21}$ may be hydrogen or a methyl group.

The structural unit represented by Chemical Formula 1 and the structural unit represented by Chemical Formula 2 may be included in a molar ratio of from 90:10 to 10:90.

The polymer may further include a structural unit represented by Chemical Formula 3:

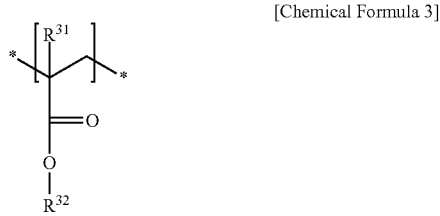

[Chemical Formula 3]

In Chemical Formula 3, $R^{31}$ may be hydrogen or a methyl group, and $R^{32}$ may be selected from a substituted or unsubstituted linear or branched C1 to C30 alkyl group, a substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

The structural unit represented by Chemical Formula 3 may be included in an amount of 1 mol % to 95 mol % based on 100 mol % of the polymer.

The polymer may have a weight average molecular weight (Mw) of 1,000 g/mol to 300,000 g/mol.

The composition may include 60 wt % to 95 wt % of the conductive powder, 0.5 wt % to 20 wt % of the glass frit, 0.1 wt % to 20 wt % of the organic binder, and a balance amount of the solvent.

The glass frit may include at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The solvent may include at least one selected from methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, and 2,2,4-trimethyl-1,3-pentanediol monoisobutyrate.

The composition may further include one or more of a surface-treatment agent, a dispersing agent, a thixotropic agent, a viscosity stabilizer, a plasticizer, an antifoaming agent, pigment, an ultraviolet (UV) stabilizer, an antioxidant, or a coupling agent.

Embodiments are also directed to an electrode manufactured using the composition according to an embodiment.

Embodiments are also directed to a solar cell including the electrode according to an embodiment.

BRIEF DESCRIPTION OF THE DRAWING

Features will become apparent to those of skill in the art by describing in detail example embodiments with reference to the attached drawings in which:

The FIGURE illustrates a schematic view showing the structure of a solar cell according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when specific definition is not otherwise provided, "substituted" refers to replacement of at least one hydrogen by a substituent selected from a halogen (F, Cl, Br, or I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof.

As used herein, when specific definition is not otherwise provided, the term "hetero" may refer to one substituted with at least one hetero atom of N, O, S and P, instead of at least one C in a cyclic substituent.

According to an example embodiment, a composition for forming an electrode may include a conductive powder, a glass frit, an organic binder, and a solvent.

Conductive Powder

The composition for forming an electrode may use a metal powder as the conductive powder. The conductive powder may include at least one element selected from silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium(V), zinc (Zn), magnesium (Mg), yttrium (Y), cobalt (Co), zirconium (Zr), iron (Fe), tungsten (W), tin (Sn), chromium (Cr), and manganese (Mn), etc.

The particle size of the conductive powder may be, for example, a nanometer or micrometer scale. For example, the conductive powder may have a particle size of dozens to several hundred nanometers, or several to dozens of micrometers. In an embodiment, the conductive powder may be a mixture of two or more types of silver powders having different particle sizes.

The conductive powder may have a particle shape of, for example, a spherical shape, a sheet-shape, or amorphous. The conductive powder may have an average particle diameter (D50) of, for example, about 0.1 μm to about 10 μm, for example about 0.5 μm to about 5 μm. The average particle diameter may be measured using, for example, Model 1064D (CILAS Co., Ltd.) equipment after dispersing the conductive powder in isopropyl alcohol (IPA) at room temperature (about 20° C. to about 25° C.) for 3 minutes via ultrasonication. Within these ranges, the composition may provide low contact resistance and low line resistance.

The conductive powder may be included in an amount of, for example, about 60 wt % to about 95 wt % based on a total weight of the composition for forming an electrode. Within these ranges, deterioration in conversion efficiency due to an increase in resistance may be prevented and hard formation of paste caused by a relative decrease of an organic vehicle may also be prevented. In an embodiment, it may be included in an amount of about 70 wt % to about 90 wt %.

Glass Frit

The glass frit may serve to enhance adhesion force between the conductive powder and the wafer or the substrate, and to form silver crystal grains in an emitter region by etching an anti-reflection layer and melting the conductive powder so as to reduce contact resistance during a firing process of the composition for forming an electrode. Further, during the sintering process, the glass frit may be softened and may decrease the firing temperature.

When the area of the solar cell is increased in order to improve solar cell efficiency, there is a possibility that contact resistance of the solar cell may be increased. Thus, it is desirable to minimize the influence on the p-n junction while minimizing series resistance. In addition, the firing temperature may vary within a broad range with increasing use of various wafers having different sheet resistances. It is desirable for the glass frit to secure sufficient thermal stability over a wide range of a firing temperature.

The glass frit may be, for example, one or more of lead glass frit and non-lead glass frit suitable for use in a composition for forming an electrode.

The glass frit may include, for example, at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The glass frit may be prepared from, for example, oxides of the chosen elements by a general method. For example, the oxides of the chosen elements may be mixed in a predetermined ratio, followed by melting the mixture, quenching the resultant, and then pulverizing the quenched product. The process of mixing may be performed using, for example, a ball mill or a planetary mill. The process of melting may be performed at, for example, about 700° C. to about 1300° C., and the quenching may be performed at, for example, room temperature (about 20° C. to about 25° C.). The process of pulverizing may be performed using, for example, a disk mill or a planetary mill.

The glass frit may have an average particle diameter (D50) of, for example, about 0.1 μm to about 10 μm, and may be included in an amount of, for example, about 0.5 wt % to about 20 wt % based on a total weight of the composition for forming an electrode. Within these ranges, the glass frit may secure excellent adhesion strength of a solar cell electrode while not deteriorating electrical characteristics of an electrode.

The glass frit may have, for example, a spherical shape or an amorphous shape. In an embodiment, two different kinds of glass frits having different glass transition temperatures may be used. For example, a first glass fit having a glass transition temperature ranging from about 200° C. to less than or equal to about 350° C. and a second glass frit having a transition temperature ranging from greater than about 350° C. to about 550° C. may be mixed in a weight ratio of about 1:0.2 to about 1:1.

Organic Binder

The organic binder may include a polymer including a structural unit represented by Chemical Formula 1 and a structural unit represented by Chemical Formula 2.

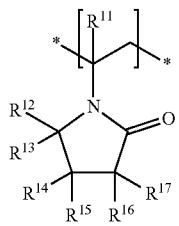

[Chemical Formula 1]

In Chemical Formula 1, $R^{11}$ may be hydrogen or a methyl group, and $R^{12}$, $R^{13}$, $R^{14}$, $R^{15}$, $R^{16}$, and $R^{17}$ may independently be selected from hydrogen and linear or branched C1 to C10 alkyl group;

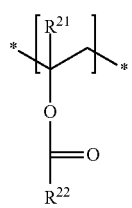

[Chemical Formula 2]

In Chemical Formula 2, $R^{21}$ may be hydrogen or a methyl group, and $R^{22}$ may be selected from a substituted or unsubstituted linear or branched C1 to C30 alkyl group, a substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

The structural unit represented by Chemical Formula 1 has a substituted or unsubstituted pyrrolidone structure and the structural unit represented by Chemical Formula 2 has a substituted or unsubstituted ester structure.

Without being bound by theory, it is believed that the nitrogen atom and the oxygen atom of the substituted or unsubstituted pyrrolidone structure may induce an electrostatic bond with the conductive powder of the composition for forming an electrode, and thus may improve dispersion of the conductive powder.

In addition, without being bound by theory, it is believed that the substituted or unsubstituted ester structure may increase compatibility with the solvent and induce hydrogen bonds with inorganic materials or other organic materials of the composition for forming an electrode, and thus may improve internal agglomeration force and decrease a line width of an electrode.

According to an example embodiment, dispersibility and storage stability may be improved, while a line width may be prevented from being increased due to collapse of an electrode pattern during the firing process.

A vinyl pyrrolidone monomer providing the structural unit represented by Chemical Formula 1 may be, for example, N-vinyl pyrrolidone, N-vinyl-3-methyl pyrrolidone, N-vinyl-5-methyl pyrrolidone, N-vinyl-3,3,5-trimethylpyrrolidone, a combination thereof, and the like.

A vinyl ester monomer providing the structural unit represented by Chemical Formula 2 may be, for example, vinyl formate, vinyl acetate, vinyl propionate, vinyl butyrate, vinyl isobutyrate, vinyl valerate, vinyl isovalerate, vinyl caproate, vinyl heptanoate, vinyl caprylate, vinyl pivalate, vinyl pelargonate, vinyl caprate, vinyl laurate, vinyl myristate, vinyl pentadecylate, vinyl palmitate, vinyl margarate, vinyl stearate, vinyl octylate, VeoVa-9 (Showa Shell Sekiyu K. K.), VeoVa-10 (Showa Shell Sekiyu K. K.), vinyl benzoate, vinyl versatate, a combination thereof, and the like.

In an example embodiment, the vinyl ester monomer may include one or more of vinyl acetate, vinyl propionate, vinyl versatate, or vinyl stearate, for example, one or more of vinyl acetate, vinyl propionate, vinyl stearate. In an example embodiment, the vinyl ester monomer may provide a structural unit represented by Chemical Formula 2-1.

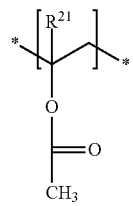

[Chemical Formula 2-1]

In Chemical Formula 2-1, $R^{21}$ may be hydrogen or a methyl group.

The structural unit represented by Chemical Formula 1 and the structural unit represented by Chemical Formula 2 may be included in a mole ratio of, for example, about 90:10 to about 10:90, for example, about 80:20 to about 20:80, for example about 70:30 to about 30:70.

When the structural units are used within the range, dispersibility of the conductive powder and compatibility with a solvent may be improved, and an electrode pattern having a fine line width and a high aspect ratio (AR) may be obtained.

The polymer may further include a structural unit represented by Chemical Formula 3.

[Chemical Formula 3]

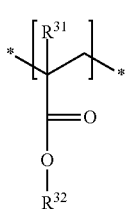

In Chemical Formula 3, $R^{31}$ may be hydrogen or a methyl group, and $R^{32}$ may be selected from a substituted or unsubstituted linear or branched C1 to C30 alkyl group, a substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

Examples of monomers providing the structural unit represented by Chemical Formula 3 may be methyl (meth) acrylate, ethyl (meth)acrylate, n-butyl (meth)acrylate, iso-butyl (meth)acrylate, t-butyl (meth)acrylate, 2-ethylhexyl (meth)acrylate, isodecyl (meth)acrylate, n-lauryl (meth) acrylate, n-tridecyl (meth)acrylate, pentadecyl (meth)acrylate, cetyl (meth)acrylate, heptadecyl (meth)acrylate, stearyl (meth)acrylate, n-butoxyethyl (meth)acrylate, butoxydiethylene glycol(meth)acrylate, methoxytriethylene glycol (meth)acrylate, methoxynonylethylene glycol(meth)acrylate, cyclohexyl (meth)acrylate, tetrahydrofurfuryl (meth) acrylate, benzyl (meth)acrylate, isobornyl (meth)acrylate, 2-hydroxyethyl (meth)acrylate, 2-hydroxypropyl (meth) acrylate, 2-hydroxybutyl (meth)acrylate, glycidyl (meth) acrylate, 2-phenoxyethyl (meth)acrylate, 2-phenoxydiethylene glycol(meth)acrylate, 2-phenoxytriethylene glycol (meth)acrylate, 2-phenoxytetraethylene glycol(meth) acrylate, 2-phenoxypentaethylene glycol(meth)acrylate, 2-phenoxyhexaethylene glycol(meth)acrylate, 2-phenoxyheptaethylene glycol(meth)acrylate, 2-phenoxyoctaethylene glycol(meth)acrylate, 2-phenoxynonaethylene glycol(meth) acrylate, 2-phenoxydecaethylene glycol(meth)acrylate, and a combination thereof.

The structural unit represented by Chemical Formula 3 may be included in an amount of about 1 mol % to about 95 mol %, for example, about 1 mol % to about 80 mol %, for example, about 1 mol % to about 50 mol % based on 100% of the polymer. Within the ranges, fine line widths may be realized.

The polymer may have a weight average molecular weight (Mw) of, for example, about 1,000 g/mol to about 300,000 g/mol. Within the range, dispersibility and printing characteristics of the composition for forming an electrode may be improved.

Solvent

The solvent may have a boiling point of, for example, about 100° C. or greater and may be, for example, methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, and 2,2,4-trimethyl-1,3-pentanediol monoisobutyrate (Texanol), which may be used alone or in a combination of two or more.

The solvent may be present in a balance amount based on the composition for forming an electrode, for example, about 1 wt % to about 30 wt % based on a total weight of the composition for forming an electrode. Within the ranges, sufficient adhesion strength and excellent printing characteristics may be secured.

The composition for forming an electrode may further include one or more additives, for example, to enhance flow properties, process properties, and stability. The additives may include, for example, a surface-treatment agent, a dispersing agent, a thixotropic agent, a plasticizer, a viscosity stabilizer, an antifoaming agent, a pigment, an ultraviolet (UV) stabilizer, an antioxidant, a coupling agent, and the like, which may be used alone or as mixtures thereof. These may be included in an amount of, for example, about 0.1 wt % to about 5 wt % based on a total weight of the composition for forming an electrode. The amount of the additive may be selected considering printing characteristics, dispersibility, and storage stability of the composition for forming an electrode.

The composition for forming an electrode may include, for example, about 60 wt % to about 95 wt % of the conductive powder; about 0.5 wt % to about 20 wt % of the glass fit; about 0.1 wt % to about 20 wt % of the organic binder; and a balance amount of the solvent. Within the ranges, the composition for forming an electrode may have appropriate viscosity and be prevented from adherence deterioration to the substrate, and may also have high resistance due to unsmooth decomposition of the organic binder during firing and prevent an electrode from being cracked, being opened, having a pin hole, and the like during the firing.

An example embodiment provides an electrode formed from a composition for forming an electrode according to an embodiment. Another example embodiment provides provides a solar cell including the electrode.

The FIGURE is a schematic view showing the structure of the solar cell according to an example embodiment.

Referring to the FIGURE, the composition for forming an electrode may be printed on a substrate 100 (including a p layer (or an n layer) 101 and an n layer (or a p layer) 102 as an emitter) and firing the composition to form a rear electrode 210 and a front electrode 230.

For example, a prior preparation step for a rear electrode may be performed by printing the composition for forming an electrode on the rear surface of the wafer and drying at about 200° C. to about 400° C. for about 10 seconds to about 60 seconds. In the drying process, the substituted or unsubstituted oxazoline or oxazine ring structure of the structural unit of Chemical Formula 1 included in the composition for forming an electrode may open and become bonded with the ester group (—O(C=O)$R^{22}$) of the structural unit of Chemical Formula 2 to form a cross-linking structure.

In addition, a prior preparation step for a front electrode may be performed by printing the composition for forming an electrode on the front surface of the wafer and drying it. Then, the front electrode 120 and the rear electrode 130 may be fired at about 400° C. to about 980° C., for example at about 700° C. to about 980° C. for about 30 seconds to about 210 seconds to form a front electrode and a rear electrode.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Organic Binder

Synthesis Example 1

60 g of isopropanol and 60 g of distilled water were added to a round-bottomed flask equipped with a condenser and provided with a nitrogen atmosphere, 65 g of N-vinyl pyrrolidone (VP), 45 g of vinyl acetate (VA) were additionally added, and the mixture was heated to 78° C. while sufficiently stirred. Next, AIBN (0.1 mol % based on a total weight of monomers) was completely dissolved in isopropanol, the resultant was slowly added thereto in a dropwise fashion through a dropping funnel and reacted at 78° C. under a nitrogen atmosphere for 4 hours. When the reaction was complete, the product therefrom was reprecipitated in ethyl acetate several times and filtered to obtain a VP/VA copolymer (mole ratio=60:40) having a weight average molecular weight of 50,000 g/mol.

Synthesis Example 2

A VP/VA copolymer (mole ratio=70:30) having a weight average molecular weight of 53,000 g/mol was obtained according to the same method as Synthesis Example 1 except for using 75 g of N-vinyl pyrrolidone and 32 g of vinyl acetate.

Synthesis Example 3

A VP/VA copolymer (mole ratio=30:70) having a weight average molecular weight of 52,000 g/mol was obtained according to the same method as Synthesis Example 1 except for using 32 g of N-vinyl pyrrolidone and 75 g of vinyl acetate.

Preparation of Compositions for Forming Electrode

Example 1

A composition for forming an electrode was prepared by sufficiently dissolving 1.5 wt % of the copolymer according to Synthesis Example 1 as an organic binder in 8.0 wt % of Texanol as a solvent at 50° C., adding 88 wt % of spherically-shaped silver powder (Dowa Hightech Co. LTD AG-5-11F) having an average particle diameter of 2.0 μm (5-8F, Dowa Hightech Co. Ltd.), 2.0 wt % of a low melting-point lead glass frit (Particology Co., Ltd., CI-124) having an average particle diameter of 1.0 μm and a transition temperature of 341° C., and 0.2 wt % of a dispersing agent BYK102 (BYK-Chemie) and 0.5 wt % of a thixotropic agent (Thixatrol ST, Elementis Co.) as additives, uniformly mixing them, and dispersing the mixture with a three roll kneader.

Example 2

A composition for forming an electrode was prepared according to the same method as Example 1 except for using the copolymer according to Synthesis Example 2 as the organic binder.

Example 3

A composition for forming an electrode was prepared according to the same method as Example 1 except for using the copolymer according to Synthesis Example 3 as the organic binder.

Comparative Example 1

A composition for forming an electrode was prepared according to the same method as Example 1 except for using ethyl cellulose (STD4, Dow Chemical) instead of the polymer according to Synthesis Example 1 as the organic binder.

Comparative Example 2

A composition for forming an electrode was prepared according to the same method as Example 1 except for using polyvinyl pyrrolidone (Sigma-Aldrich, molecular weight 55,000 g/mol) instead of the polymer according to Synthesis Example 1 as the organic binder.

Property Evaluation (1) Storage Stability

Storage stability of the compositions for forming an electrode was evaluated as their viscosity variation ratios before and after the storage according to Equation 1, and the results are shown in Table 1.

$$\Delta F = \frac{F_1}{F_0} \times 100 \qquad \text{[Equation 1]}$$

$F_0$ is viscosity measured at room temperature (25° C.) after storing the compositions for forming an electrode at 25° C. under relative humidity of 50±5% for 1 day, and $F_1$ is viscosity measured at room temperature (25° C.) after storing the compositions for forming an electrode at 25° C. under relative humidity 50±5% for 30 days.

The viscosity measurements were obtained by using a viscosity meter (HBDV-2+pro, Brookfield Engineering Laboratories) and mounting SC4-14 spins and a SC4-6RP chamber thereon, and then preshearing the compositions at 25° C. and 10 rpm for 30 seconds.

(2) Fine Pattern Evaluation

Each composition for forming an electrode according to Examples 1 to 3 and Comparative Examples 1 and 2 was used to screen-print an electrode pattern (a finger bar) on the front surface of a poly P-type silicon wafer having sheet resistance of 90Ω with a screen mask and then, dried by using an infrared ray-drying furnace. Then, the rear surface of the wafer was printed with a composition for forming an electrode including aluminum and then dried in the same method as above. Subsequently, a cell manufactured through the above process was fired at a 400 to 950° C. for 30 to 50 seconds by using a belt-type furnace, and the number of broken lines (L/B) was counted by using an EL tester (MV Tech Inc.) in order to examine whether the manufactured electrodes (finger bars) were disconnected or not, and the line width and thickness of an electrode line were measured with a VK equipment (VK9710, KEYENCE Co.). The results are shown in Table 1.

Screen mask: SUS325 type/Emulsion thickness: 15 μm/Line width of finger bar: 30 μm/number of finger bar: 100

TABLE 1

|  | Example 1 | Example 2 | Example 3 | Comparative Example 1 | Comparative Example 2 |
|---|---|---|---|---|---|
| Line width after firing (μm) | 55 | 56 | 57 | 65 | 60 |
| Thickness after firing (μm) | 16 | 15.5 | 15 | 14 | 14.5 |
| Aspect ratio (thickness/line width) | 0.29 | 0.28 | 0.26 | 0.21 | 0.24 |
| Printability (Number of L/B) | 0 | 0 | 0 | 18 | 15 |

Referring to Table 1, the compositions for forming an electrode according to Examples 1 to 3 showed better storage stability and finer line widths in the electrode patterns manufactured therefrom compared with the compositions for forming an electrode according to Comparative Example 1 and Comparative Example 2.

By way of summation and review, electrodes of a solar cell may be formed with predetermined patterns on a surface of a substrate using a composition for forming an electrode, and patterning and firing the same. Conversion efficiency of a solar cell may be improved by, for example, improving contact properties of electrodes with the substrate, and thus minimizing contact resistance ($R_c$) and series resistance ($R_s$) or adjusting pattern line widths of a screen mask with an organic material to be smaller, and thus forming fine lines so as to increase a shortcut current ($I_{sc}$). However, reducing line widths of the electrode pattern with the screen mask may lead to increasing series resistance ($R_s$) and deteriorating continuous printability of a fine pattern. A composition for forming an electrode may use an organic vehicle to impart desirable viscosity and rheological characteristics for printing. The amount of the organic binder may be increased or a polymer having high molecular weight may be used in order to increase dispersibility and storage stability. However, when the amount of the organic binder is increased, resistance may also be increased during formation of an electrode, and when the organic binder having high molecular weight is used, a tailing phenomenon and a printing defect may result due to increased viscosity even for a high shear rate.

As described above, embodiments may provide a composition for forming an electrode capable of forming a high-resolution fine pattern and exhibiting improved printing characteristics, dispersibility, and storage stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of symbols>

| 100: substrate | 101: p layer (or n layer) |
|---|---|
| 102: n layer (or p layer) | 210: rear electrode |
| 230: front electrode | |

What is claimed is:

1. A composition for forming an electrode, comprising a solvent, a conductive powder, a glass frit, and an organic binder, the organic binder including a polymer that includes a structural unit represented by Chemical Formula 1 a structural unit represented by Chemical Formula 2, and a structural unit represented by Chemical Formula 3:

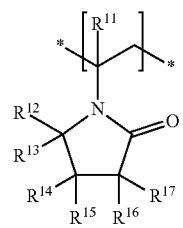

[Chemical Formula 1]

wherein, in Chemical Formula 1, $R^{11}$ is hydrogen or a methyl group, $R^{12}$, $R^{13}$, $R^{14}$, $R^{15}$, $R^{16}$, and $R^{17}$ are independently selected from hydrogen and a linear or branched C1 to C10 alkyl group;

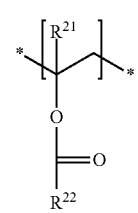

[Chemical Formula 2]

wherein, in Chemical Formula 2, $R^{21}$ is hydrogen or a methyl group, and $R^{22}$ is selected from a substituted or unsubstituted linear or branched C1 to C30 alkyl group, a substituted or unsubstituted linear or branched C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group,

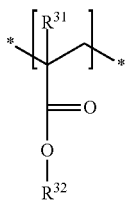

[Chemical Formula 3]

wherein, in Chemical Formula 3,

R³¹ is hydrogen or a methyl group, and

R³² is selected from a substituted or unsubstituted linear branched C1 to C30 alkyl group, a substituted or unsubstituted linear branch C1 to C30 alkoxy group, a substituted or unsubstituted C3 to C30 cycloalkyl group, a substituted or unsubstituted C3 to C30 heterocycloalkyl group, a substituted or unsubstituted C6 to C30 aryl group, and a substituted or unsubstituted C3 to C30 heteroaryl group.

2. The composition as claimed in claim 1, wherein the structural unit represented by Chemical Formula 2 is represented by Chemical Formula 2-1:

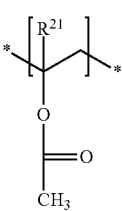

[Chemical Formula 2-1]

wherein, in Chemical Formula 2-1,

R²¹ is hydrogen or a methyl group.

3. The composition as claimed in claim 1, wherein the structural unit represented by Chemical Formula 1 and the structural unit represented by Chemical Formula 2 are included in a molar ratio of from 90: 10 to 10: 90.

4. The composition as claimed in claim 1, wherein the structural unit represented by Chemical Formula 3 is included in an amount of 1 mol % to 95 mol % based on the total mole number of the structural units in the polymer.

5. The composition as claimed in claim 1, wherein the polymer has a weight average molecular weight (Mw) of 1,000 g/mol to 300,000 g/mol.

6. The composition as claimed in claim 1, wherein the composition comprises
60 wt % to 95 wt % of the conductive powder;
0.5 wt % to 20 wt % of the glass frit;
0.1 wt % to 20 wt % of the organic binder; and
a balance amount of the solvent.

7. The composition as claimed in claim 1, wherein the glass frit includes at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

8. The composition as claimed in claim 1, wherein the solvent includes at least one selected from methyl cellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, and 2,2,4-trimethyl-1,3-pentanediol monoisobutyrate.

9. The composition as claimed in claim 1, further comprising one or more of a surface-treatment agent, a dispersing agent, a thixotropic agent, a viscosity stabilizer, a plasticizer, an antifoaming agent, pigment, an ultraviolet (UV) stabilizer, an antioxidant, or a coupling agent.

10. An electrode manufactured using the composition as claimed in claim 1.

11. A solar cell comprising the electrode as claimed in claim 10.

* * * * *